(12) United States Patent
Itoh et al.

(10) Patent No.: US 9,252,000 B2
(45) Date of Patent: Feb. 2, 2016

(54) MICROWAVE WAVEGUIDE APPARATUS, PLASMA PROCESSING APPARATUS AND PLASMA PROCESSING METHOD

(71) Applicants: TOKYO ELECTRON LIMITED, Minato-ku (JP); NATIONAL UNIVERSITY CORPORATION NAGOYA UNIVERSITY, Nagoya-shi (JP)

(72) Inventors: Hitoshi Itoh, Tsukuba (JP); Yusuke Kubota, Tsukuba (JP); Hirotaka Toyoda, Nagoya (JP); Masaru Hori, Nagoya (JP)

(73) Assignees: NATIONAL UNIVERSITY CORPORATION NAGOYA UNIVERSITY, Nagoya-shi (JP); TOKYO ELECTRON LIMITED, Minato-ku (JP)

( * ) Notice: Subject to any disclaimer, the term of this patent is extended or adjusted under 35 U.S.C. 154(b) by 0 days.

(21) Appl. No.: 14/159,499

(22) Filed: Jan. 21, 2014

(65) Prior Publication Data
US 2014/0251955 A1    Sep. 11, 2014

(30) Foreign Application Priority Data
Mar. 5, 2013    (JP) .................................. 2013-043404

(51) Int. Cl.
C23C 16/00     (2006.01)
C23F 1/00      (2006.01)
H01L 21/306    (2006.01)
H01J 37/32     (2006.01)

(52) U.S. Cl.
CPC ..... H01J 37/32229 (2013.01); H01J 37/32211 (2013.01)

(58) Field of Classification Search
USPC .............................. 156/345.41; 118/723 MW
See application file for complete search history.

(56) References Cited

U.S. PATENT DOCUMENTS

| | | | | |
|---|---|---|---|---|
| 3,814,983 A * | 6/1974 | Weissfloch et al. | ............. | 315/39 |
| 4,711,983 A * | 12/1987 | Gerling | ......................... | 219/694 |
| 5,230,740 A * | 7/1993 | Pinneo | .................. | 118/723 MW |
| 6,204,606 B1 * | 3/2001 | Spence et al. | ............ | 315/111.21 |
| 6,784,620 B1 * | 8/2004 | Peters | ...................... | 315/111.21 |

(Continued)

FOREIGN PATENT DOCUMENTS

| | | |
|---|---|---|
| JP | 2002-526903 | 8/2002 |
| JP | 2006-059798 | 3/2006 |

(Continued)

*Primary Examiner* — Rakesh Dhingra
(74) *Attorney, Agent, or Firm* — Oblon, McClelland, Maier & Neustadt, L.L.P.

(57) ABSTRACT

A microwave waveguide apparatus for generating plasma includes a waveguide which has first and second ends and propagates microwave from input end such that the microwave propagates from the first end to the second end, a circulator device having a first port, a second port coupled to the first end, and a third port coupled to the second end, the circulator device being structured such that the microwave is received at the first port, propagates from the second port to the first end, is received at the third port from the second end and is returned toward the input end, and a matching device which is interposed between the input end and the circulator device and reflects part of the microwave received at the third port and returned toward the input end to the first port. The waveguide has a slot-hole extending along the microwave propagation direction in the waveguide.

20 Claims, 13 Drawing Sheets

(56) References Cited

U.S. PATENT DOCUMENTS

| | | |
|---|---|---|
| 7,545,226 B2 | 6/2009 | Shinohara |
| 2003/0066487 A1* | 4/2003 | Suzuki .................. 118/723 MW |
| 2005/0082004 A1* | 4/2005 | Kasai ....................... 156/345.41 |
| 2010/0186670 A1* | 7/2010 | Ikeda ..................... 118/723 AN |

FOREIGN PATENT DOCUMENTS

| | | |
|---|---|---|
| JP | 2010-080350 | 4/2010 |
| JP | 4900768 B | 1/2012 |
| JP | 2012-064444 | 3/2012 |
| WO | WO 2006/033278 | 3/2006 |

* cited by examiner

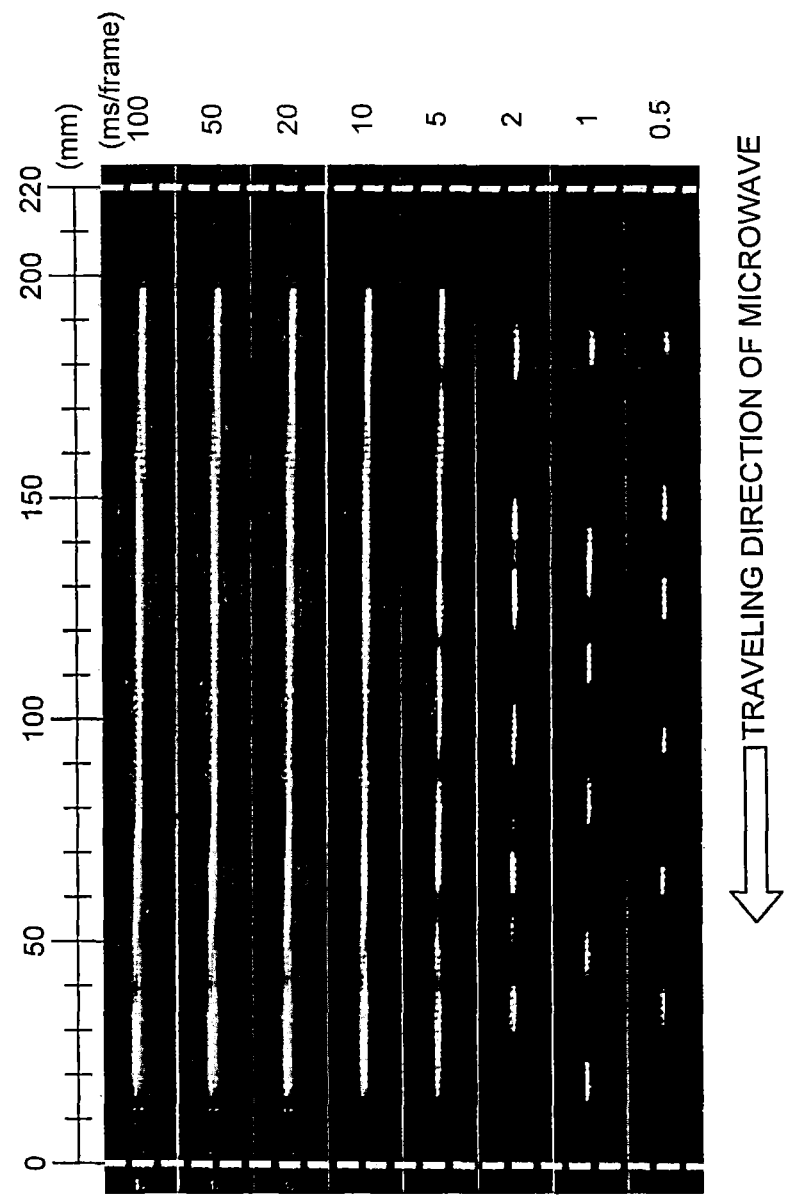

MICROWAVE WAVEGUIDE APPARATUS, PLASMA PROCESSING APPARATUS AND PLASMA PROCESSING METHOD

CROSS-REFERENCE TO RELATED APPLICATIONS

The present application is based upon and claims the benefit of priority to Japanese Patent Application No. 2013-043404, filed Mar. 5, 2013, the entire contents of which are incorporated herein by reference.

BACKGROUND OF THE INVENTION

1. Field of the Invention

The present invention relates to a microwave waveguide apparatus, a plasma processing apparatus and a plasma processing method.

2. Description of Background Art

Regarding an apparatus that generates plasma from gas using a microwave supplied to a waveguide, Japanese translation of PCT Laid-Open Patent Application No. 2002-526903 describes a plasma generator having a linear waveguide in which a long, narrow slot penetrating a wall in the waveguide is formed, and a microwave power source connected to this waveguide. In such a plasma generator, a microwave power source supplies microwave power to the waveguide to generate plasma in a slot.

Also, Japanese Laid-Open Patent Application No. 2012-64444 describes a plasma-generating apparatus structured to have a rectangular waveguide that is connected to a microwave-generating device and is long in a transmission direction of a microwave; a gas-supply device that supplies a processing gas into the rectangular waveguide; and an antenna unit that has multiple rectangular slot holes formed on one surface of the rectangular waveguide and that discharges plasma generated in the slot holes to the outside. In such a device, a standing wave is formed in the rectangular waveguide, and the slot holes that discharge plasma to the outside of the rectangular waveguide are formed at positions of a microwave corresponding to antinode portions of a standing wave in the antenna unit.

Japanese Patent No. 4900768 describes a plasma-generating apparatus having an annular resonator that resonates a traveling wave, and multiple applicators coupled to multiple couplers that direct the microwave and guide the microwave to a plasma-generating chamber (FIG. 1). In such an apparatus, as FIG. 2 shows, a directional coupler that guides a reflected wave propagated into the annular resonator to a dummy load is provided between an introduction waveguide and the annular resonator. The entire contents of these publications are incorporated herein by reference.

SUMMARY OF THE INVENTION

According to one aspect of the present invention, a microwave waveguide apparatus for generating plasma includes: a waveguide which has first and second end portions and propagates a microwave from an input end such that the microwave propagates from the first end portion to the second end portion in the waveguide; a circulator device which has a first port, a second port coupled to the first end portion, and a third port coupled to the second end portion, the circulator device being structured such that the microwave is received at the first port, propagates from the second port to the first end portion of the waveguide, is received at the third port from the second end portion and is returned toward the input end; and a matching device which is interposed between the input end and the circulator device and reflects a portion of the microwave received at the third port of the circulator device and returned toward the input end to the first port of the circulator device. The waveguide has a slot-hole portion extending along a propagation direction of the microwave propagating in the waveguide.

According to another aspect of the present invention, a plasma processing apparatus includes: a microwave generating device which generates a microwave and supplies the microwave to an input end; a waveguide which has a first end portion and a second end portion and propagates the microwave from the input end such that the microwave propagates from the first end portion to the second end portion in the waveguide, the waveguide having a slot-hole portion extending along a propagation direction of the microwave propagating in the waveguide; a circulator device which has a first port, a second port coupled to the first end portion, and a third port coupled to the second end portion, the circulator device being structured such that the microwave is received at the first port, propagates from the second port to the first end portion of the waveguide, is received at the third port from the second end portion and is returned toward the input end; a matching device which is interposed between the input end and the circulator device and reflects a portion of the microwave received at the third port of the circulator device and returned toward the input end to the first port of the circulator device; a first directional coupling device which is positioned in the waveguide and passes the waveguide propagating from the first end to the second end of the waveguide and blocks the microwave propagating from the second end to the first end of the waveguide; a gas supply device which supplies a gas such that the gas receives energy of the microwave supplied to the slot-hole portion of the waveguide; and a processing container which has a space structured such that plasma generated from the gas processes a process target.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 8 is an image of a plasma generated by the microwave supply device in FIG. 7;

FIG. 9($b$) is a graph illustrating a relationship between the sizes and gaps of the dotted plasmas and the microwave power;

DETAILED DESCRIPTION OF THE EMBODIMENTS

Figure 1:
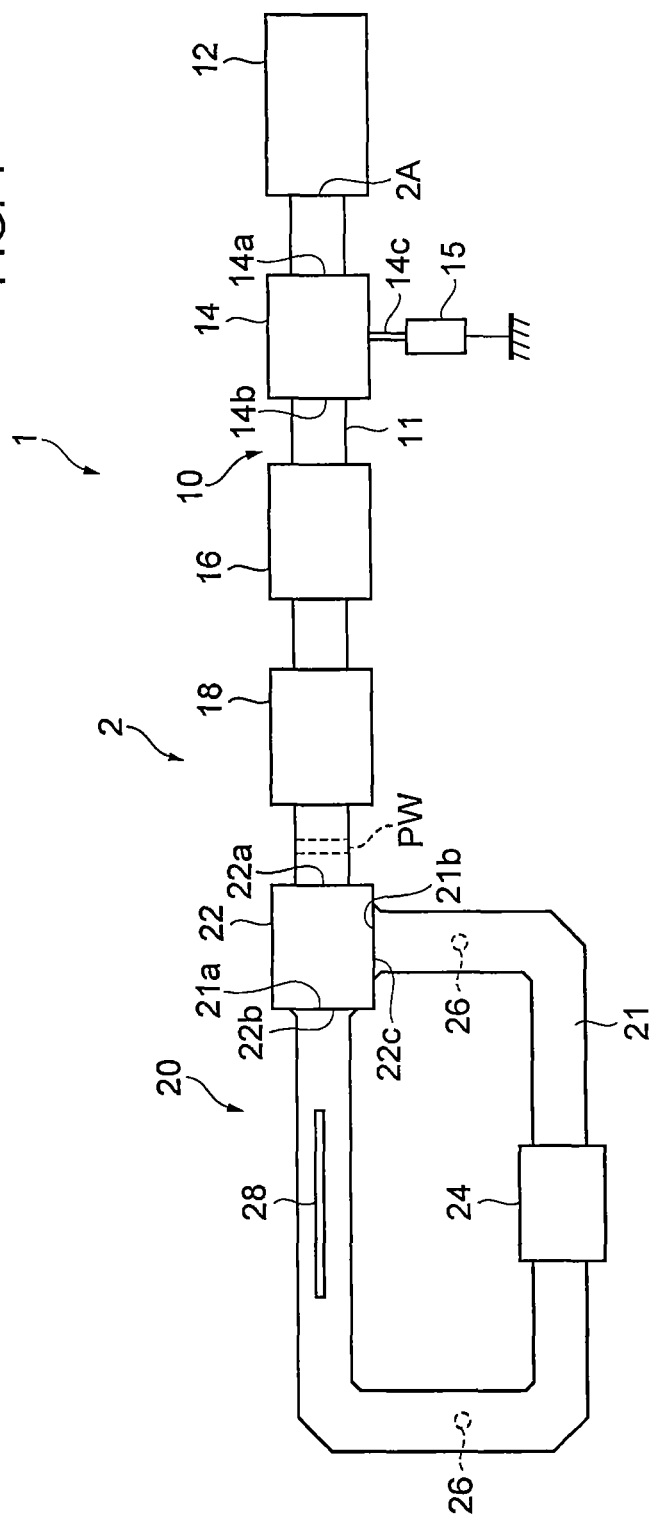
FIG. 1 is a plan view illustrating a microwave supply device according to one embodiment.

The embodiments will now be described with reference to the accompanying drawings, wherein like reference numerals designate corresponding or identical elements throughout the various drawings.

First, a microwave supply device 1 according to one embodiment is described. FIG. 1 is a plan view schematically illustrating the microwave supply device 1 according to one embodiment seen from a side on which a slot hole is provided.

The microwave supply device 1 illustrated in FIG. 1 is formed by connecting a microwave generator 12 to an input end (2A) of a microwave waveguide apparatus 2. The microwave waveguide apparatus 2 has an introduction waveguide section 10 and an annular waveguide section 20. The introduction waveguide section 10 is formed by coupling an isolator 14, a directional coupler 16 and an EH tuner 18 in that order from the input end (2A) side. A matching box such as a 4E tuner or a stub tuner may be provided instead of the EH tuner 18.

The waveguide 11 has a hollow structure, and part of the introduction waveguide section 10 which allows a microwave to propagate is formed in internal space of the waveguide 11. The waveguide 11 is a rectangular waveguide which is long in a transmission direction of the microwave. The waveguide 11 can be made of metal such as copper, aluminum, iron or stainless steel or an alloy of those metals. The pressure in the waveguide 11 is atmospheric, for example.

The microwave generator 12 is coupled to the input end (2A), which is one end of the waveguide 11. The microwave generator 12 supplies, for example, a microwave of about 2.45 GHz to the waveguide 11. The microwave supplied to the waveguide 11 is propagated to the annular waveguide section 20. The microwave generator 12 has a pulse oscillating function in one embodiment and may generate a pulsed microwave. The microwave generator 12 is connected to a control unit (Cont) described below, and microwave power, pulse frequency, duty ratio and the like are controlled according to a control signal from the control unit (Cont). Although the pulse generated by the microwave generator 12 may be a square wave or a sine wave, the pulse is preferred to be a square wave.

Figure 2:
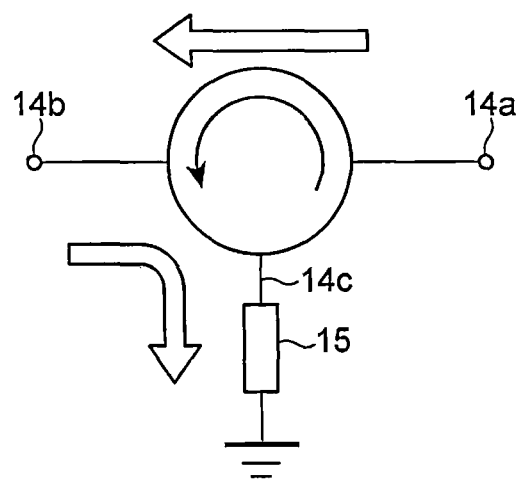
FIG. 2 is a view illustrating a function of an isolator.

The isolator 14 is coupled to the waveguide 11 at a subsequent portion of the microwave generator 12. As illustrated in FIG. 2, the isolator 14 has a first port (14a), which is coupled to a side of the waveguide 11 on which the microwave generator 12 is provided, a second port (14b), which is coupled to a side of the waveguide 11 on which the EH tuner is provided, and a third port (14c), which is coupled to a dummy port 15. At the first port (14a), the isolator 14 receives the microwave from the microwave generator 12 and propagates the microwave from the second port (14b) to a side of the waveguide 11 on which the EH tuner is provided. Meanwhile, at the second port (14b), the isolator 14 receives the microwave from the side of the waveguide 11 on which the EH tuner is provided and propagates that microwave from the third port to a dummy port 15. That is, by passing the microwave from the microwave generator 12 toward the annular waveguide section 20, and by guiding to the dummy port 15 the microwave, which travels from the annular waveguide section 20 side toward the microwave generator 12, the isolator 14 protects the microwave generator 12 from reflected power.

The directional coupler (second directional coupler) 16 is coupled to the waveguide 11 at a subsequent portion of the isolator 14. The directional coupler 16 allows the microwave from the input end (2A) side to pass, while blocking the microwave from the EH tuner 18 side. This directional coupler 16 cancels a reflected wave, and prevents generation of a standing wave in the waveguide 11.

The EH tuner 18 is a device that has an E tuner unit (18e) and an H tuner unit (18h) (see FIG. 6 described below), and adjusts impedance by putting plungers of the E tuner unit (18e) and the H tuner unit (18h) in and out. When the microwave supply device 1 operates, the EH tuner 18 is adjusted in such a way that a reflected wave from the annular waveguide section 20 is minimized. By adjusting the EH tuner 18 and changing a reflection coefficient and a transmission coefficient of the EH tuner 18, the microwave outputted from the annular waveguide section 20 via a circulator 22 described below is reflected to the annular waveguide section 20 side.

The annular waveguide section 20 includes a waveguide 21 and the circulator 22. The annular waveguide section 20 may have a length of 160 cm, for example. The waveguide 21 has a hollow structure, and part of the annular waveguide section 20 that allows the microwave to propagate is formed in internal space of the waveguide 21. That is, the waveguide 21 is a rectangular waveguide. The waveguide 21 has a first end (21a) and a second end (21b), and extends along an annular route from the first end (21a) to the second end (21b). The waveguide 21 may be made of a metal such as copper, aluminum, iron or stainless steel or an alloy of those metals. The pressure in the waveguide 21 is atmospheric, for example.

Figure 3:
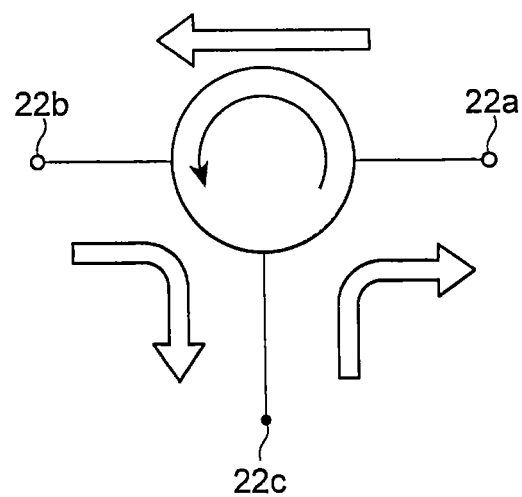
FIG. 3 is a view illustrating a function of a circulator.

As illustrated in FIG. 3, the circulator 22 has a first port (22a) coupled to the other end of the waveguide 11, a second port (22b) coupled to the first end (21a), and a third port (22c) coupled to the second end (21b). The circulator 22 receives at the first port (22a) the microwave from the microwave generator 12, and propagates the microwave from the second port (22b) to the first end (21a). Further, the circulator 22 receives at the second port (22b) the microwave from the first end (21a), and propagates the microwave from the third port (22c) to the second end (21b). Furthermore, the circulator 22 receives at the third port (22c) the microwave from the second end (21b), and returns that microwave from the first port (22a) toward the microwave generator 12. As described, the introduction waveguide section 10 and the annular waveguide section 20 are coupled by the circulator 22. By so setting, the microwave generated by the microwave generator 12 is supplied into the annular waveguide section 20.

In the waveguide 21, gas supply hole 26 is formed to supply in the waveguide 21 processing gas for producing highly reactive chemical species such as a radical or an ion. The processing gas supplied through the gas supply holes 26 circulates in the waveguide 21 and is discharged to the outside from a slot hole 28 described below. According to one embodiment, two gas supply holes 26 are provided in the waveguide 21. Distances between the two gas supply holes 26 and the slot hole 28 are preferred to be mutually equal. By so setting, the processing gas is uniformly supplied in the slot hole 28.

Figure 4:
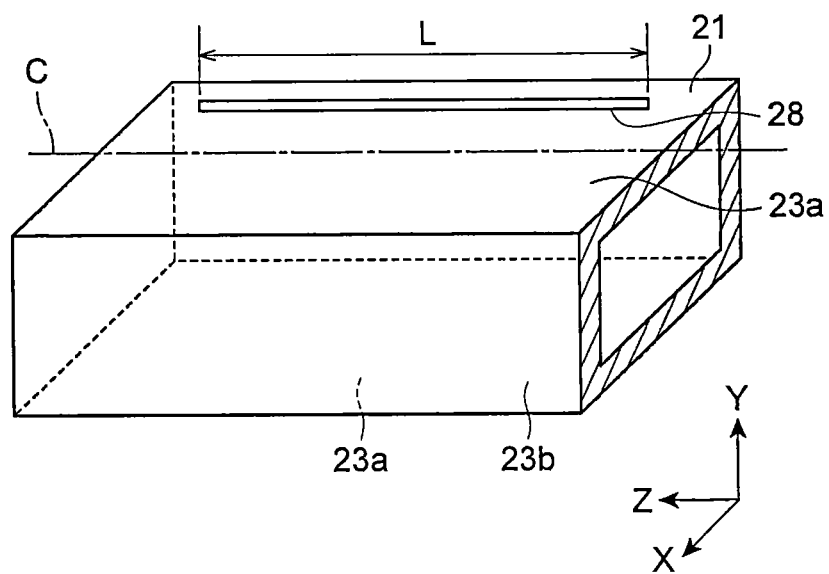
FIG. 4 is a perspective view of a formation position of a slot hole of a waveguide.

In the waveguide 21, the slot hole 28 is formed, extending in the propagation direction of the microwave. The slot hole 28 functions as a gas blast hole which discharges plasma generated using the microwave to the outside of the waveguide 21. FIG. 4 is a perspective view of a formation position of the slot hole 28 of the waveguide 21. In addition, in FIG. 4, a width direction of the waveguide 21 is an (X) direction, a propagation direction of the microwave is a (Z) direction and a direction orthogonal to the (X) direction and the (Z) direction is a (Y) direction.

As illustrated in FIG. 4, the waveguide 21 has a pair of wall portions (23a) and a pair of wall portions (23b) arranged orthogonally to a pair of wall portions (23a). The wall portions (23a) are formed wider than the wall portions (23b). The slot hole 28 is formed by cutting part of the wall portion (23a) of the waveguide 21, and has a long shape that adopts the propagation direction of the microwave as a long axis direction. The dimensions of the wall portions (23a) are not limited specifically, and may be set at, for example, 300 mm long and 96 mm wide. The slot hole 28 may be set to have any dimensions based on the length of desired plasma, for example, a length (L) of 220 mm and a width of 0.5 mm. Moreover, it is an option to form the slot hole 28, for example, at a position shifted from a center axis (C) in a length direction (Z direction) of the wall portions (23a) (for example, at a position shifted 40 mm from the center axis (C)) to be parallel to the center axis (C). Alternatively, the slot hole 28 may be formed to correspond to the center axis (C) in a length direction of the wall portion (23a). Yet alternatively, the slot hole 28 may also be formed in the wall portion (23b) of the waveguide 21, which is a short side in the cross section.

When the microwave is supplied from the microwave generator 12, processing gas supplied through the gas supply holes 26 is excited by an electric field generated by the microwave in the slot hole 28, and plasma is generated in the slot hole 28.

Figure 5:
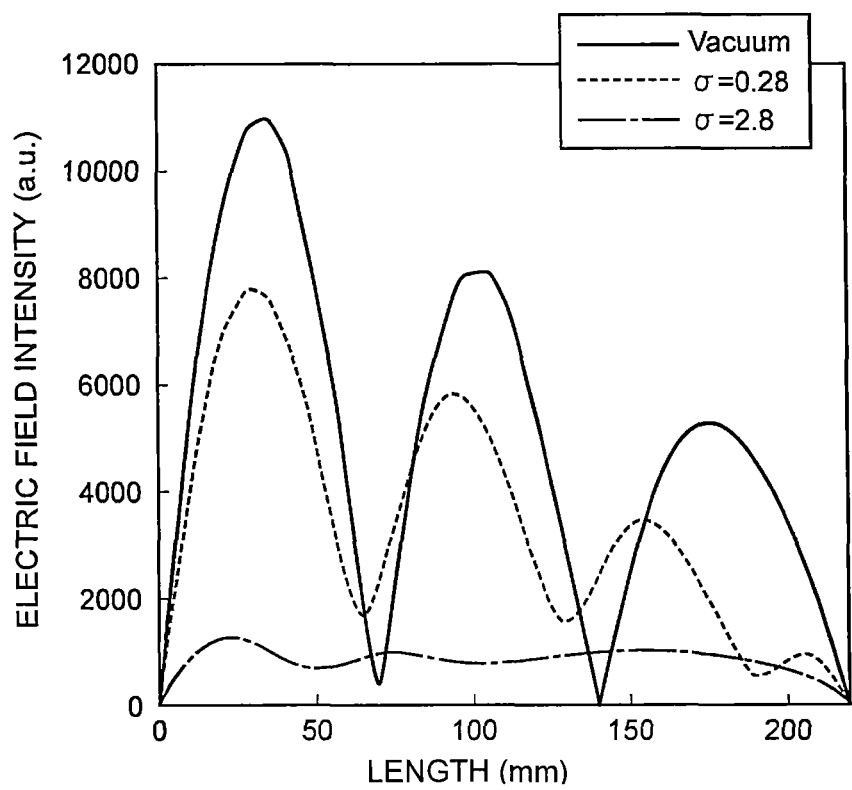
FIG. 5 illustrates a simulation result illustrating an electric field intensity at the formation position of the slot hole.

Back to FIG. 1, the directional coupler (first directional coupler) 24 is interposed halfway along the waveguide 21 according to one embodiment. The directional coupler 24 allows the microwave propagated from the first end (21a) to the second end (21b) to pass, and blocks the microwave propagated from the second end (21b) to the first end (21a). FIG. 5 illustrates an electric field intensity at a formation position of the slot hole 28 calculated by simulation. In a graph illustrated in FIG. 5, the horizontal axis indicates a distance from an end portion of the slot hole 28 and the vertical axis indicates an electric field intensity. According to that simulation, each electric field intensity is calculated when there are media with different electric conductivity in the waveguide 21 (vacuum, a medium of 0.28 S/m and a medium of 2.6 S/m). As illustrated in FIG. 5, a microwave is reflected at the end portion of the slot hole 28 in the waveguide 21. According to one embodiment, the directional coupler 24 is connected to the waveguide 21 to cancel a component which is included in a reflected wave generated in the slot hole 28 and which is propagated from the second end (21b) to the first end (21a).

Back to FIG. 1 again, the microwave waveguide apparatus 2 has a partition wall (PW) between the EH tuner 18 and the circulator 22 according to one embodiment. This partition wall (PW) is formed by a dielectric body such as quartz, ceramic or Teflon. The partition wall (PW) blocks processing gas (such as reducing gas, reactive gas or highly reactive gas dissociated by plasma) from passing through the waveguide 21 so as to prevent processing gas from entering the microwave generator 12. Meanwhile, the partition wall (PW) allows the microwave from the microwave generator 12 to pass.

Next, a propagation route of a microwave in the microwave waveguide apparatus 2 is described. The microwave supplied from the microwave generator 12 reaches the first port (22a) of the circulator 22 through the isolator 14, the directional coupler 16 and the EH tuner 18, and is outputted from the second port (22b). The microwave outputted from the second port (22b) consumes most of the energy by generating plasma in the slot hole 28 while the microwave propagates from the first end (21a) of the waveguide 21 to the second end (21b). Further, a reflected wave of a microwave is generated in the slot hole 28 in the waveguide 21. A component of such a reflected wave propagated from the second end (21b) to the first end (21a) (a component propagated in a clockwise direction in the waveguide 21 in FIG. 1) is combined with the microwave supplied from the microwave generator 12 and causes generation of a standing wave in the waveguide 21. However, the microwave waveguide apparatus 2 prevents generation of a standing wave in the waveguide 21. The reasons are described below.

A component which is included in the reflected wave generated in the slot hole 28 and which is propagated in a direction from the second end (21b) of the waveguide 21 to the first end (21a) (a component propagated in the clockwise direction in the waveguide 21 in FIG. 1) reaches the second port (22b) of the circulator 22, and is outputted from the third port (22c). The reflected wave outputted from the third port (22c) is blocked by the directional coupler 24. Accordingly, since there is no reflected wave that causes generation of a standing wave in the waveguide 21, generation of the standing wave is prevented in the waveguide 21. Meanwhile, the component of the reflected wave propagated from the first end (21a) of the waveguide 21 to the second end (21b) (the component propagated in a counterclockwise direction in the waveguide 21 in FIG. 1) passes through the directional coupler 24, reaches the third port (22c) and is outputted from the first port (22a). In addition, the component of the reflected wave propagated in a direction from the first end (21a) of the waveguide 21 to the second end (21b) travels in the same traveling direction as the microwave supplied from the microwave generator 12, and therefore does not generate a standing wave in the waveguide 21. Part of the reflected wave of the microwave outputted from the first port (22a) is reflected by the EH tuner 18 together with the microwave which passes through the first end (21a), the second end (21b), the third port (22c) and the first port (22a) in that order. Further, the microwave reflected by the EH tuner 18 is superimposed on the microwave from the microwave generator 12 and is returned to the waveguide 21 through the first port (22a). That is, the microwave is circulated in an annular waveguide by functions of the waveguide 21, the circulator 22 and the EH tuner 18. As a result, energy of a microwave is accumulated by way of superimposition in the annular waveguide portion 20. A remaining portion included in the reflected wave of the microwave outputted from the first port (22a) and not reflected by the EH tuner 18 is canceled by the directional coupler 16 or the isolator 14.

Figure 6:
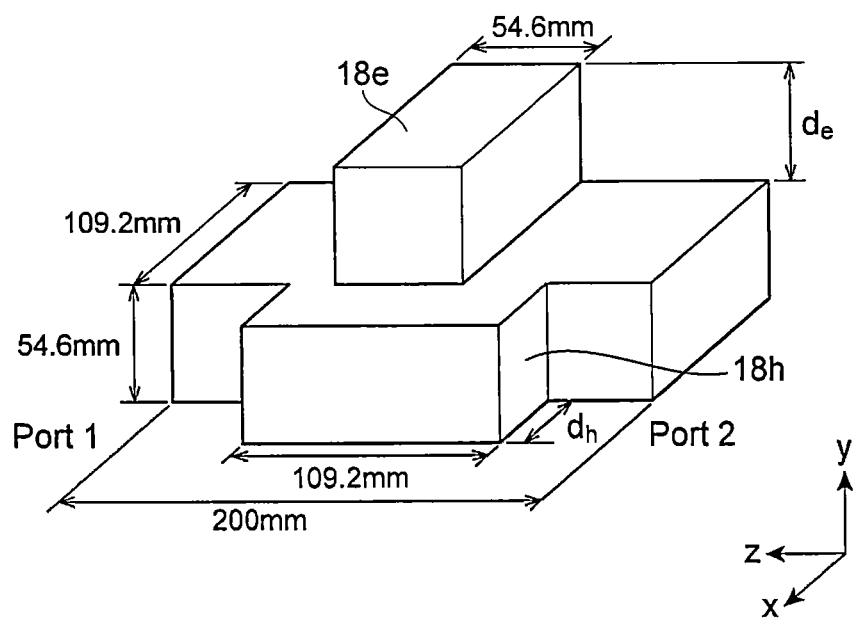
FIG. 6 is a view illustrating an example of an EH tuner.

Next, adjustment of a plunger of the EH tuner 18 is described. FIG. 6 is a schematic view illustrating an example of the plunger of the EH tuner. Plunger positions ($d_e$, $d_h$) illustrated in FIG. 6 indicate a plunger position of the E tuner unit (18e) and a plunger position of the H tuner unit (18h). In the example illustrated in FIG. 6, by setting the plunger position ($d_e$) of the E tuner unit (18e) at 11.5 mm and the plunger position ($d_h$) of the H tuner unit (18h) at 25.0 mm, the reflected wave from the annular waveguide portion 20 is minimized. When the plunger position ($d_o$) and the plunger position ($d_h$) are set in this way, an (S) parameter calculated by simulation is as follows.

|$S_{11}$|=0.7605
|$S_{21}$|=0.6407
arg($S_{11}$)=45.63
arg($S_{21}$)=135.8

Next, a relationship between a signal ($I_0$) which enters the annular waveguide portion 20 from the EH tuner 18 and a signal (I) which enters the EH tuner 18 from the annular waveguide portion 20 in the microwave supply device 1 is described. In the following, the transmission coefficient of the EH tuner 18 is referred to as (T), the reflection coefficient of the EH tuner 18 as (R) and the reflection coefficient of the slot hole 28 as ($\Gamma p$). In this case, when a signal that returns from the EH tuner 18 to the microwave generator 12 is ($\Gamma$), the signal ($\Gamma$) is expressed as in equation (1).

Mathematical Formula 1

$$\begin{aligned}\Gamma &= R + T \cdot \Gamma_p \cdot T + T \cdot \Gamma_p \cdot (R \cdot \Gamma_p) \cdot T + \ldots \\ &= R + T^2 \cdot \Gamma_p(1 + R \cdot \Gamma_p + \ldots \\ &= R + \frac{T^2 \cdot \Gamma_p}{1 - R \cdot \Gamma_p}\end{aligned} \quad (1)$$

According to equation (1), the reflection coefficient (Fp) is expressed as in equation (2).

Mathematical Formula 2

$$\Gamma_p = \frac{\Gamma - R}{T^2 + (\Gamma - R) \cdot R} \quad (2)$$

Further, the signal ($I_0$) is expressed as in equation (3).

Mathematical Formula 3

$$\begin{aligned}I_0 &= T + T \cdot \Gamma_p \cdot R + T \cdot (\Gamma_p \cdot R)^2 + \ldots \\ &= \frac{T}{1 - R \cdot \Gamma_p} \\ &= \frac{T}{1 - R \frac{\Gamma - R}{T^2 + (\Gamma - R) \cdot R}} \\ &= \frac{T \cdot (T^2 + (\Gamma - R) \cdot R)}{T^2 + (\Gamma - R) \cdot R - R \cdot (\Gamma - R)} \\ &= \frac{T^2 + (\Gamma - R) \cdot R}{T}\end{aligned} \quad (3)$$

Meanwhile, the signal (I) is expressed as in equation (4).

Mathematical Formula 4

$$I - T \cdot \Gamma_p + T \cdot \Gamma_p \cdot R \cdot \Gamma_p + T \cdot \Gamma_p \cdot (R \cdot \Gamma_p)^2 + \ldots - \frac{T \cdot \Gamma_p}{1 - R \cdot \Gamma_p} - \frac{\Gamma - R}{T} \quad (4)$$

Here, when |r|=|$S_{11}$|, $f_r$=arg($S_{11}$), |t|=|$S_{21}$|, $f_t$=arg($S_{21}$), and $\Gamma$=0 (that is, a signal that returns to the microwave generator 12 is 0), the signal ($I_0$) and a signal intensity (|$I_0$|$_2$) of the signal ($I_0$) are expressed as in equations (5) and (6).

Mathematical Formula 5

$$I_0 = \frac{T^2 - R^2}{T} = \frac{|t|^2 \cdot e^{j2\theta_t} - |r|^2 \cdot e^{j2\theta_r}}{|t| \cdot e^{j\theta_t}} \quad (5)$$

Mathematical Formula 6

$$|I_0|^2 = |t|^2 + \frac{|r|^4}{|t|^2} - 2|r|^2 \cdot \cos(2\theta_r - 2\theta_t) \quad (6)$$

Similarly, when $\Gamma$=0, the signal (I) and a signal intensity (|I|$_2$) of the signal (I) are expressed as in equations (7) and (8).

Mathematical Formula 7

$$I = \frac{R}{T} = -\frac{|r| \cdot e^{j\theta_r}}{|t| \cdot e^{j\theta_t}} \quad (7)$$

Mathematical Formula 8

$$|I|^2 = \frac{|r|^2}{|t|^2} \quad (8)$$

Here, when |$S_{11}$|=0.7605, |$S_{21}$|=0.6407, arg($S_{11}$)=45.63, and arg($S_{21}$)=135.8 obtained by simulation are substituted in equations (6) and (7), the signal intensity |$I_0$|$_2$=2.38 and the signal intensity |I|$_2$=1.41. As described above, a ratio of the signal intensity (|$I_0$|$_2$) and the signal intensity (|I|$_2$) obtained by simulation is 1.69. This simulation result shows that, in the microwave waveguide apparatus 2, part of a signal incident on the EH tuner 18 from the annular waveguide portion 20 is reflected by the EH tuner 18, and is superimposed on the signal entering the annular waveguide portion 20 from the EH tuner 18 to increase the signal in the annular waveguide portion 20.

Further, when power input from the introduction waveguide portion 10 to the annular waveguide portion 20 and power in the annular waveguide portion 20 are measured by a power monitor, while the power input from the microwave generator 12 to the annular waveguide portion 20 is 150 W, the power in the annular waveguide portion 20 is 200 W. Thus, it was found that the microwave supplied from the microwave generator 12 to the annular waveguide portion 20 was circulated in the annular waveguide portion 20 so as that the power in the annular waveguide portion 20 was increased 1.33 times the power of the microwave supplied from the microwave generator 12 to the annular waveguide portion 20.

Next, another embodiment describes the plasma processing apparatus 3 having the above microwave supply device 1. The plasma processing apparatus 3 is described as an atmospheric pressure plasma processing apparatus that performs plasma processing from the second end on a process target (W) under atmospheric pressure.

Figure 7:
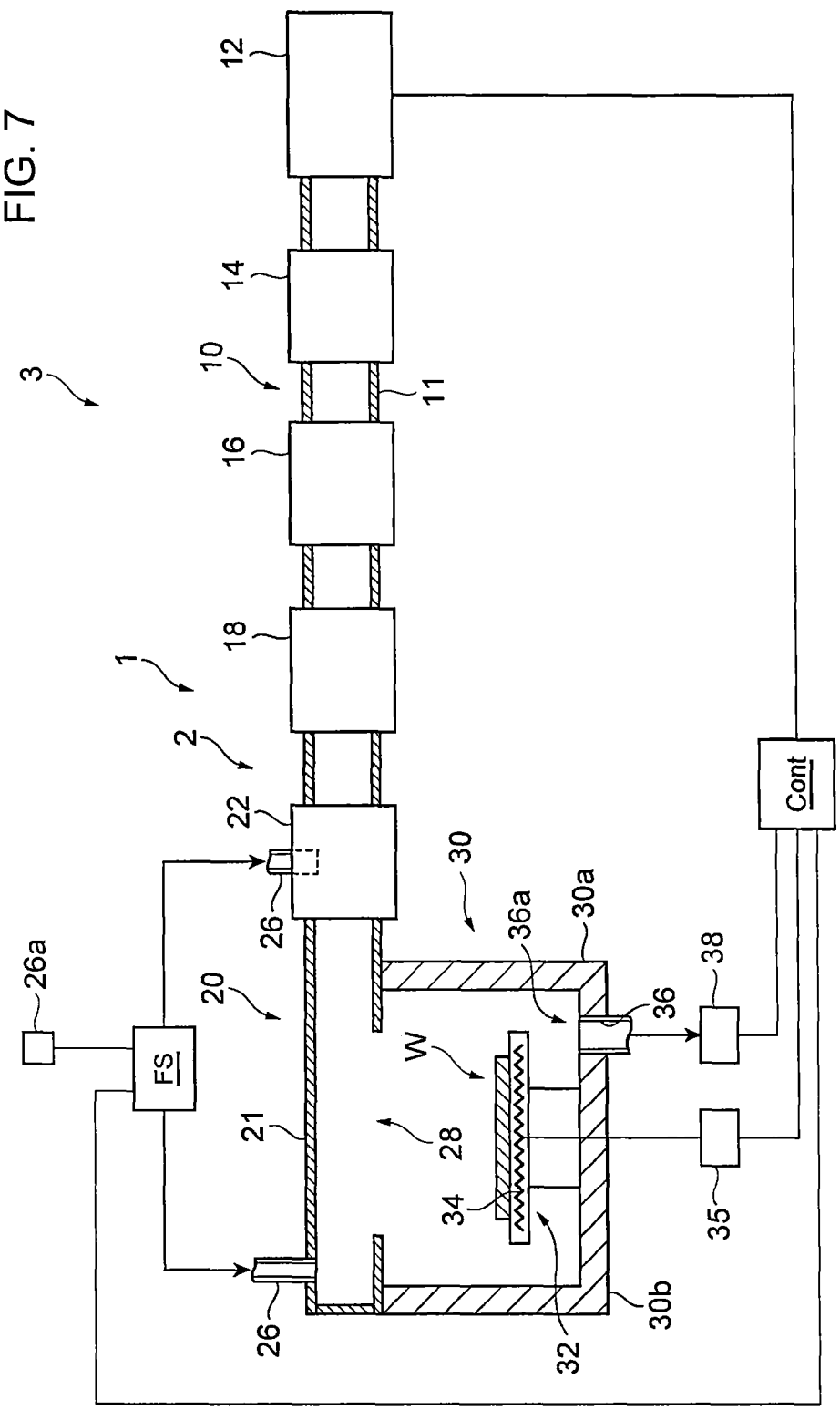
FIG. 7 is a cross-sectional view illustrating a plasma processing apparatus having the microwave supply device according to one embodiment.

FIG. 7 is a cross-sectional view illustrating the plasma processing apparatus 3 according to one embodiment. The plasma processing apparatus 3 illustrated in FIG. 7 has the microwave supply device 1, the gas supply unit (26a) and a processing container 30.

The gas supply unit (26a) may also have a gas source, a valve and a flow rate controller. The gas supply unit (26a) supplies processing gas from the gas source into the waveguide 21 through a flow splitter (FS) and the gas supply holes 26. The flow splitters (FS) distribute the processing gas supplied from the gas supply units (26a) to the two gas supply holes 26 at a distribution rate set by, for example, the control unit (Cont) described below. The gas supply unit (26a) and the gas supply holes 26 function as gas supply units that supply processing gas to receive the energy of the microwave supplied from the slot hole 28. The processing gas supplied from the gas supply unit (26a) is a gas containing, for example, helium (He), argon (Ar) or hydrogen ($H_2$) or a mixture of these gases. The processing gas may further contain nitrogen gas ($N_2$). Moreover, the processing gas may be hydrogen gas with a concentration of 4% or less, more preferably, 0.1% to 4%. In the microwave waveguide apparatus 2 according to one embodiment, a high energy microwave is propagated through the slot hole 28, so that high-density plasma is generated under atmospheric pressure even when hydrogen gas with a low concentration is used. Consequently, a large number of hydrogen radicals are generated and processing performance is improved.

The processing container 30 forms the space for processing the process target (W). The processing container 30 includes a sidewall (30a) and a bottom wall (30b). The sidewall (30a) has a substantially cylindrical shape extending in a vertical direction. The bottom wall (30b) is provided on a lower end side of the sidewall (30a). An exhaust tube 36 with an exhaust hole (36a) is attached to the bottom wall (30b). The exhaust tube 36 is connected to an exhaust device 38. The exhaust device 38 is controlled by the control unit (Cont) described below, and controls the flow rate of gas to be exhausted to adjust the pressure in the processing container 30. The exhaust device 38 has a vacuum pump such as a dry pump. The exhaust device 38 adjusts the pressure in the processing container 30 to a desired level, that is, to atmospheric pressure. A top portion of the processing container 30 is an open portion. In addition, the exhaust device 38 may be connected to the waveguide 21 through an exhaust tube and a valve to adjust the pressure in the waveguide 21.

A stage 32 is provided in the processing container 30. The process target (W) is set on the stage 32. According to one embodiment, a heater 34 which is a heating element may be provided inside the stage 32. The heater 34 is connected to a heater power source 35, and generates heat by power supplied from the heater power source 35 and heats the stage 32. The heater power source 35 is controlled by the control unit (Cont) described below, and controls the power to be supplied to the heater 34 to adjust the amount of heat generated by the heater 34.

The waveguide 21 is arranged on the top portion of the processing container 30 so that the slot hole 28 faces the process target (W). The waveguide 21 may cover the entire top surface of the processing container 30 or may cover only part of the top surface.

According to one embodiment, the plasma processing apparatus 3 has a control unit (Cont) that controls each portion of the plasma processing apparatus 3. The control unit (Cont) supplies or stops supplying a microwave from the microwave generator 12, controls microwave power, pulse frequency, duty ratio and the like, controls the flow rate of processing gas using the flow splitter (FS), controls reduction of the pressure in the processing container 30 using the exhaust device 38 and controls the temperature of the stage 32 in the processing container 30 using the heater power source 35. The control unit (Cont) is, for example, a programmable computer device.

Next, a plasma processing method according to one embodiment using the above microwave supply device 1 is described. According to the embodiment, the process target (W) is carried into the processing container 30 to be set on the stage 32. That is, the process target (W) is arranged at a position opposite the slot hole 28.

Next, the control unit (Cont) controls the flow splitter (FS) to supply processing gas into the waveguide 21. Then, the control unit (Cont) controls the microwave generator 12 to generate a microwave, and supplies the microwave to the annular waveguide portion 20 through the introduction waveguide portion 10. It is an option for the control unit (Cont) to supply a microwave into the waveguide 21 with the same timing as that of the processing gas.

Thus, by supplying the microwave and the processing gas into the waveguide 21, the processing gas is excited by the electric field produced by the microwave and a virtually linear plasma is generated in a slot hole. Then, the process target (W) is subjected to plasma processing by the virtually linear plasma.

As described above, in the microwave supply device 1, the microwave generated in the microwave generator 12 is guided to the first end (21a) of the waveguide 21, and the microwave that reaches the second end (21b) of the waveguide 21 is returned to the first end (21a) of the waveguide 21. Thus, by circulating in the waveguide 21 the microwave that is inputted into the waveguide 21, energy of the microwave in the waveguide 21 is increased. Further, the waveguide 21 and the circulator 22 form an annular shape of the annular waveguide portion 20, so that generation of a reflected wave which may form a standing wave in the annular waveguide portion 20 is prevented. That is, in the annular waveguide portion 20, substantially no reflected wave is produced at positions except the slot hole 28. As a result, generation of a standing wave in the annular waveguide portion 20 is prevented and the intensity of the microwave in the annular waveguide portion 20 is made uniform. Consequently, the microwave supply device 1 supplies a microwave which can stably generate linear plasma from the slot hole 28 formed in the waveguide 21.

Such linear plasma can be used for plasma processing of a large area substrate such as a flat panel, a solar cell or electronic paper. For example, a substrate surface can be subjected to plasma processing by linear plasma by carrying a sheet substrate with a large area by a roll-to-roll method. Further, this plasma can also be suitably used for processing of a glass substrate.

Further, by generating a pulsed microwave from the microwave generator 12 in the above-described microwave supply device 1, dotted plasma moves at a high speed in a propagation direction of the microwave, so that substantially linear plasma, that is, long plasma, is generated as a whole. Meanwhile, when a non-pulse microwave is generated from the microwave generator 12, continuously linear plasma is generated. Such continuously linear plasma is a low-density plasma with low uniformity. By contrast, the dotted plasma has very high density. Further, since dotted plasma moves at a high speed, it is considered to have high uniformity in an extension direction of the slot hole 28. For example, when the process target (W) is moved in a direction orthogonal to a slot shaft direction and the process target (W) is subjected to plasma processing using such moving dotted plasma, the dotted plasma is sufficiently fast compared with a moving speed of the process target (W), so that plasma processing is performed uniformly on the process target (W). Thus, the microwave supply device 1 can supply a microwave that can generate highly uniform plasma.

For example, when 1% hydrogen gas obtained by diluting argon is used, processing gas is dissociated in a discharge region and high-density hydrogen radicals are generated. Such hydrogen radicals reach the process target (W) positioned facing the slot hole 28 by transport and diffusion of gas, and contribute to normalization of the surface of the process target (W) or reduction of an oxide. Meanwhile, the hydrogen radicals move together with a discharge region, so that the microwave supply device 1 can achieve surface processing of the process target (W) of a large area.

According to the above embodiment, since no mechanism is involved so as to mechanically change transmission of a microwave, such as a plunger in the annular waveguide portion 20, stable plasma is generated without depending on, for example, operational precision or response speed. Further, the structure of a device is simplified compared when using a mechanism that mechanically changes transmission of a microwave. Accordingly, maintenance is easier and the cost of a device is lowered. The microwave supply device 1 has on the route of the waveguide 21 the directional coupler 24 that allows a traveling wave of a microwave to pass and blocks a reflected wave of the microwave. As a result, the reflected wave is blocked while the microwave circulates in the annular waveguide portion 20, and generation of a standing wave in the annular waveguide portion is reliably prevented.

In the above plasma processing apparatus 3, processing gas is excited by energy of the microwave supplied to the slot hole 28, thus allowing the stable generation of a virtually linear plasma. Further, plasma processing on the process target (W) can be performed using such plasma.

In the following, an evaluation made on the plasma processing apparatus 3 is described. Here, a virtually linear plasma was generated using the plasma processing apparatus 3 illustrated in FIG. 7, and various characteristics of such plasma were evaluated. Processing conditions of the plasma processing apparatus 3 are as follows.

Processing Conditions:
Microwave power: 1.2 kW
Microwave frequency: 2.45 GHz
Pulse frequency: 20 kHz
Duty ratio of pulse wave: 30%
Processing gas: He
Flow rate of processing gas: 1.4 slm
Pressure: 1 atm First, dotted plasmas were generated under the above processing conditions using the plasma processing apparatus 3, and the plasmas were observed by changing shutter speed and capturing images of the plasmas. FIG. 8 illustrates the plasmas generated and captured under the above processing conditions. As illustrated in an image captured at a shutter speed of 100 ms, it was found that a long (linear) plasma of 180 mm was generated under the above processing conditions. Meanwhile, as illustrated in an image captured at a shutter speed of 0.5 ms, it was found that such a plasma was formed when dotted plasmas (discharge region) having a length of about 10 mm moved in the traveling direction of the microwave. Thus, the plasma generated under the above processing conditions is plasma that looks linear as a whole when the dotted plasmas move at a high speed in the traveling direction of the microwave. Such a plasma is a highly uniform virtually linear plasma.

Figure 9A:
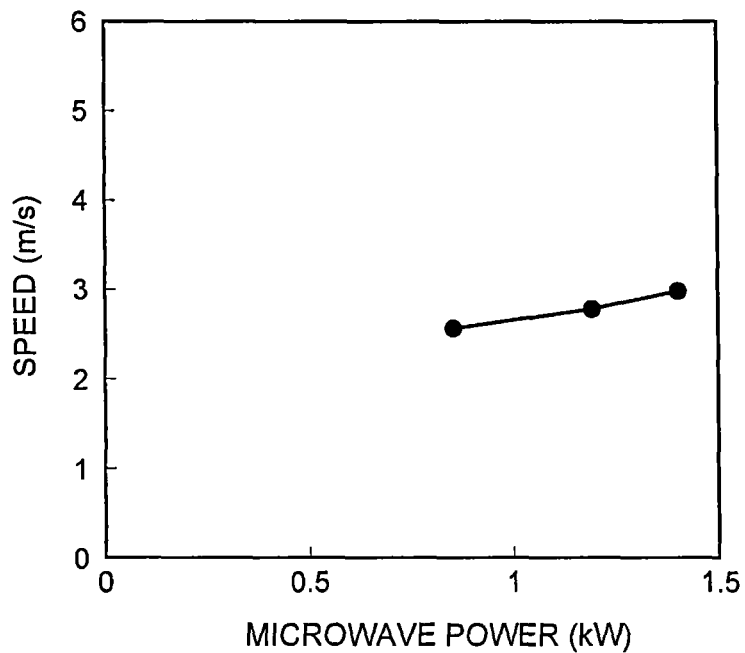
FIG. 9($a$) is a graph illustrating a relationship between the moving speed of dotted plasmas and microwave power.

Next, dependence on microwave power of the dotted plasmas generated under the above processing conditions was evaluated. FIG. 9(a) is a graph illustrating a relationship between the moving speed of dotted plasmas and microwave power. As illustrated in FIG. 9(a), it was found that the moving speed of the dotted plasmas increased following an increase in the microwave power.

Figure 9B:
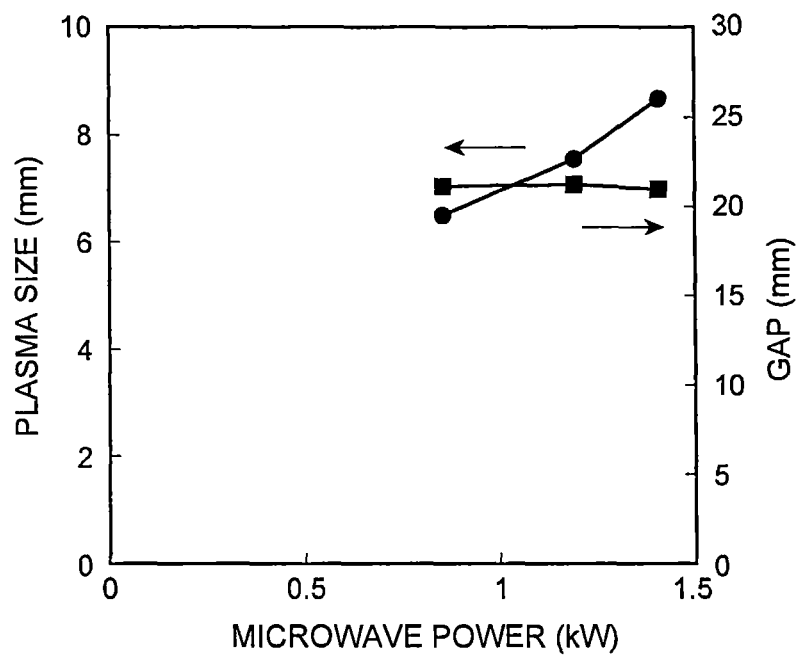

FIG. 9(b) is a graph illustrating a relationship between the sizes and gaps of dotted plasmas and microwave power. Here, the size of plasma indicates a length of a dotted plasma, and a gap indicates the distance between adjacent dotted plasmas. In FIG. 9(b), circular plots indicate plasma sizes, and square plots indicate gaps. As illustrated in FIG. 9(b), it was found that the sizes of dotted plasmas increased following an increase in microwave power. As illustrated in FIG. 9(b), it was found that the gaps between dotted plasmas did not depend on microwave power.

Figure 10A:
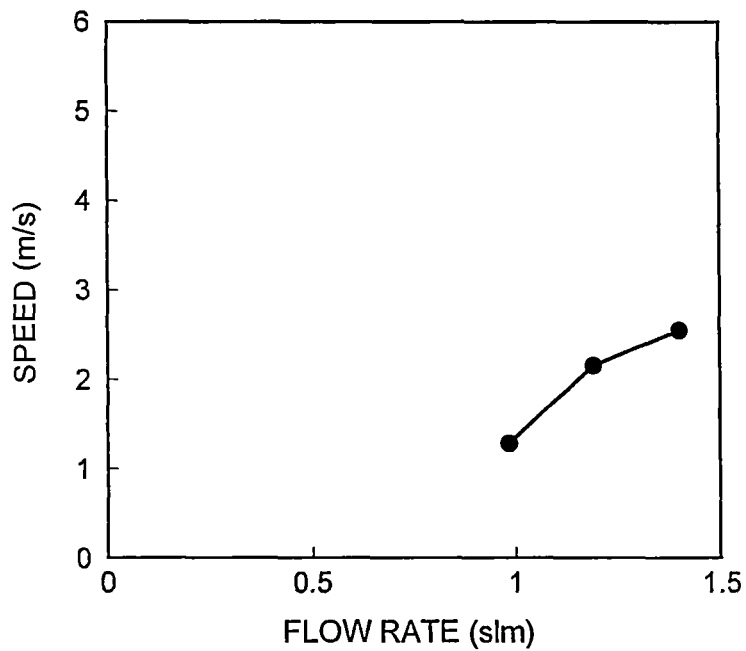
FIG. 10($a$) is a graph illustrating a relationship between the moving speed of the generated dotted plasmas and the flow rate of processing gas.
FIG. 10(b) is a graph illustrating a relationship between the sizes and gaps of dotted plasmas and the flow rate of processing gas.

Next, dependence of dotted plasmas on the flow rate of processing gas was evaluated. Processing conditions of the plasma processing apparatus 3 are the same as above except for the flow rate of the processing gas. FIG. 10(a) is a graph illustrating the relationship between the moving speed of generated dotted plasmas and the flow rate of processing gas. As illustrated in FIG. 10(a), it was found that the moving speed of the dotted plasmas increased following an increase in the flow rate of the processing gas.

Figure 10B:
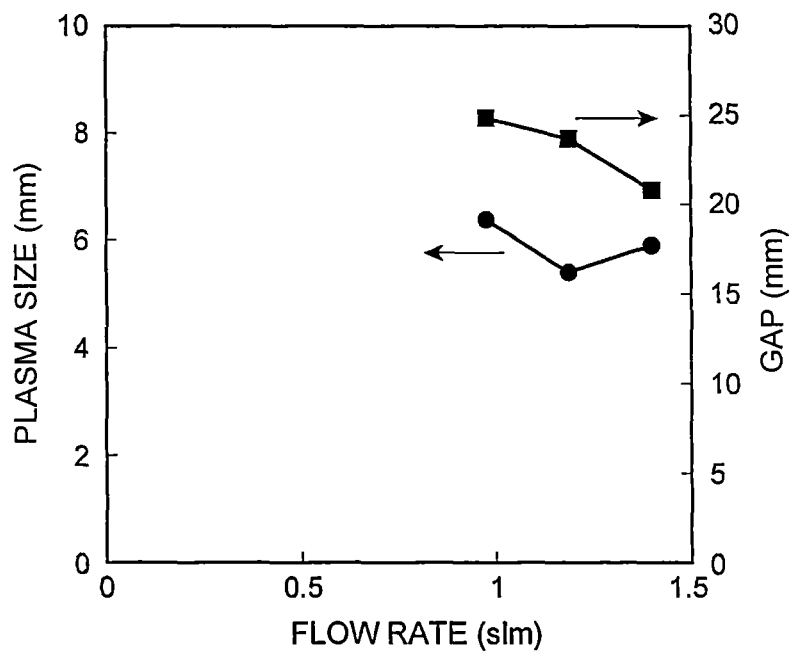

FIG. 10(b) is a graph illustrating the relationship between the sizes and gaps of dotted plasmas and the flow rate of processing gas. In FIG. 10(b), circular plots indicate sizes of plasmas, and square plots indicate gaps. As illustrated in FIG. 10(b), it was found that the sizes of dotted plasmas did not depend on the flow rate of processing gas. Further, it was found that the gaps between dotted plasmas decreased following an increase in the flow rate of the processing gas.

Figure 11A:
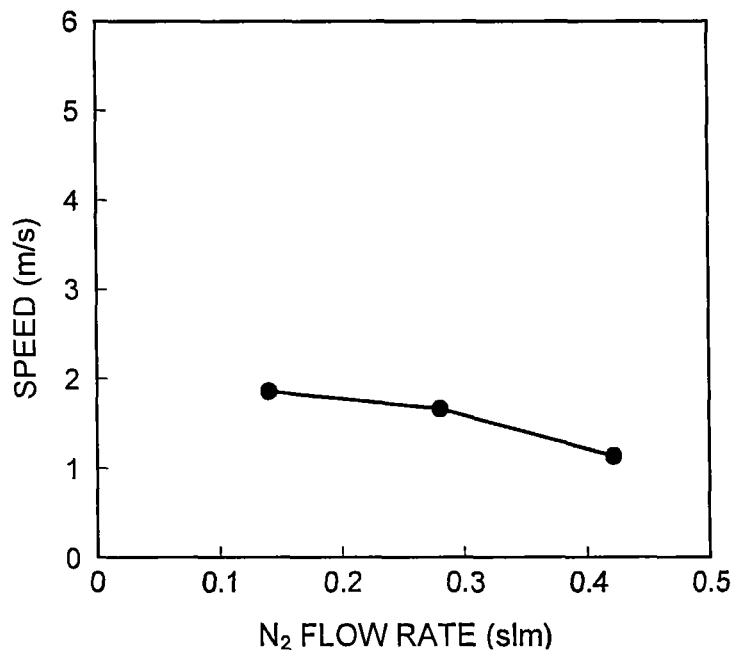
FIG. 11(a) is a graph illustrating a relationship between the moving speed of the generated dotted plasmas and the flow rate of $N_2$ gas.

Next, dependence of dotted plasmas on the flow rate of $N_2$ was evaluated. $N_2$ gas was added to processing gas and was supplied into the waveguide 21. The processing conditions of the plasma processing apparatus 3 are the same as above except for the flow rate of $N_2$ gas. FIG. 11(a) is a graph illustrating a relationship between the moving speed of generated dotted plasmas and the flow rate of $N_2$ gas.

As illustrated in FIG. 11(a), it was found that the moving speed of the dotted plasmas decreased following an increase in the flow rate of $N_2$ gas.

Figure 11B:
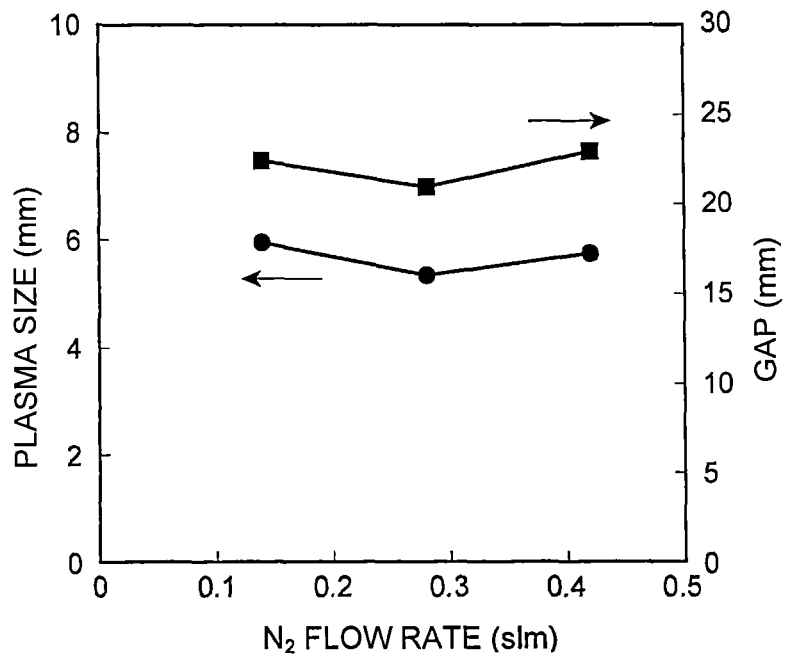
FIG. 11(b) is a graph illustrating a relationship between the sizes and gaps of the dotted plasmas and the flow rate of $N_2$ gas.

FIG. 11(b) is a graph illustrating the relationship between the sizes and gaps of dotted plasmas and the flow rate of $N_2$ gas. As illustrated in FIG. 11(b), circular plots indicate plasma sizes, and square plots indicate gaps. As illustrated in FIG. 11(b), it was found that the sizes of dotted plasmas did not depend on the flow rate of $N_2$ gas. Further, it was found that the gaps between dotted plasmas did not depend on the flow rate of $N_2$ gas.

Figure 12:
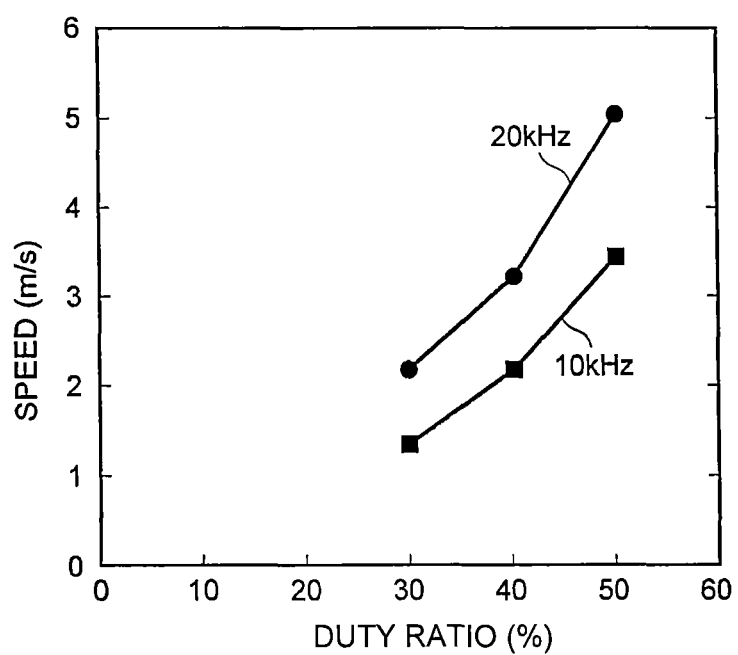
FIG. 12 is a graph illustrating a relationship between the moving speed of dotted plasmas, pulse frequency and duty ratio.

Next, dependence of dotted plasmas on pulse frequency and duty ratio was evaluated. Processing conditions of the plasma processing apparatus 3 upon this evaluation were the same as the above processing conditions except for pulse frequency and duty ratio. FIG. 12 is a graph illustrating the relationship between the moving speed of dotted plasmas, pulse frequency and duty ratio. As illustrated in FIG. 12, it was found that the moving speed of the dotted plasmas increased following an increase in pulse frequency. Further, it was found that the moving speed of the dotted plasmas increased following an increase in duty ratio.

Figure 13A:
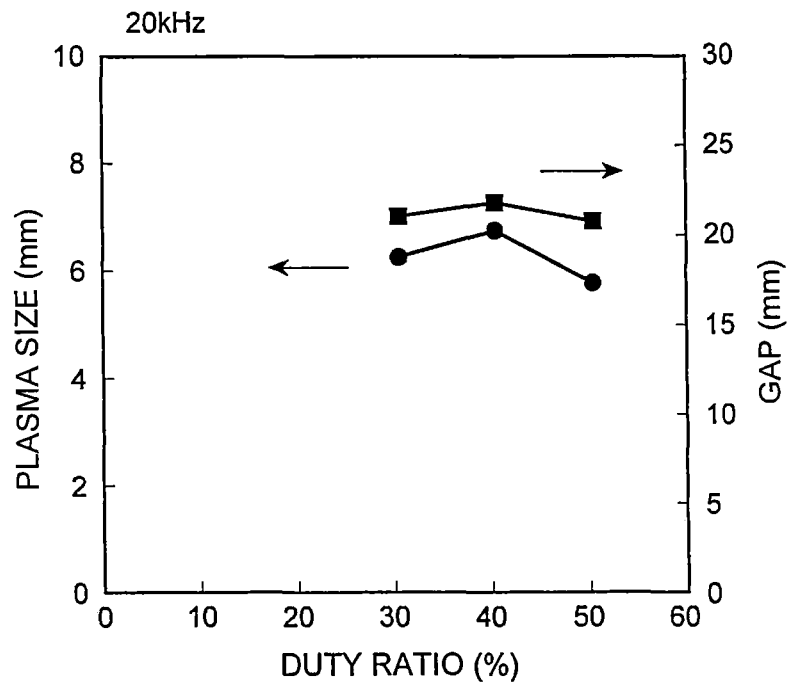
FIGS. 13(a) and 13(b) show graphs illustrating a relationship between the sizes and gaps of dotted plasmas, pulse frequency and duty ratio.
Figure 13B:
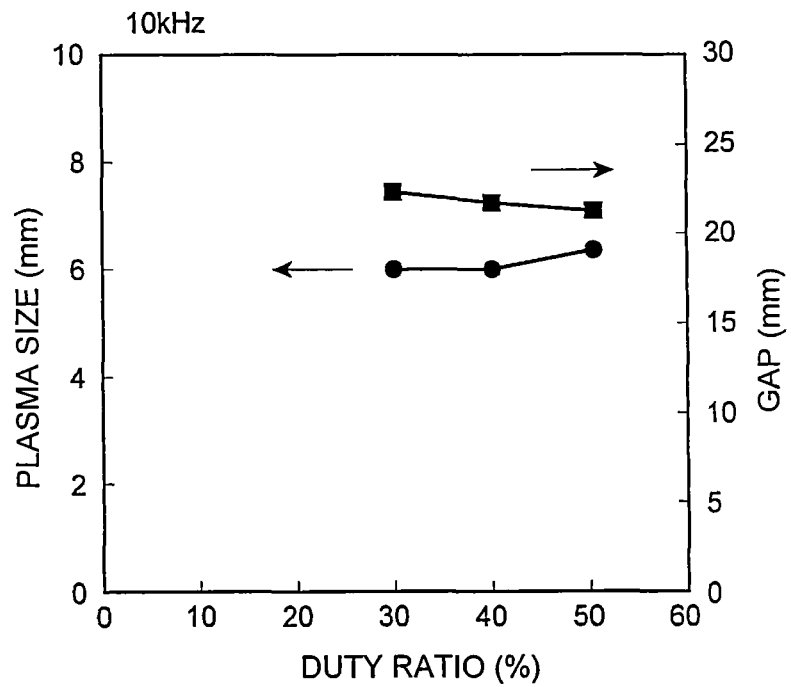

FIG. 13 shows graphs illustrating the relationship between the sizes and gaps of dotted plasmas, pulse frequency and duty ratio. The processing conditions of the plasma processing apparatus 3 upon this evaluation are the same as above except for the pulse frequency and the duty ratio. FIG. 13(a) is a graph in which the pulse frequency is 20 kHz, and FIG. 13(b) is a graph in which a pulse frequency is 10 kHz. In FIGS. 13(a) and 13(b), circular plots indicate plasma sizes, and square plots indicate gaps. As illustrated in FIGS. 13(a) and 13(b), it was found that the sizes and gaps of dotted plasmas did not depend on pulse frequency and duty ratio.

The embodiments according to the present invention have been described above. However, the present invention is not limited to the above embodiments, and various modifications may be employed.

For example, the plasma processing apparatus 3 generates plasma under atmospheric pressure in the above embodiment. However, it is an option to use the plasma processing apparatus 3 for generating plasma under a reduced pressure. A modified example of a plasma processing apparatus 3 that generates plasma under a reduced pressure is described in the following.

A plasma processing apparatus according to a modified example has, directly below a slot hole 28, a dielectric body window made of quartz, ceramic or alumina. Moreover, instead of a waveguide 21, gas supply holes 26 are provided to penetrate through sidewalls (30a) of a processing container 30 positioned below the dielectric body window, and processing gas from a gas supply unit (26a) is supplied into the processing container 30. An exhaust device 38 reduces the pressure in the processing container 30 to a desired level. The dielectric body window allows a microwave received from the slot hole 28 to transmit so that the microwave is supplied into the processing container 30. Accordingly, processing gas is excited by an electric field produced directly below the dielectric body window, and plasma is generated in the processing container 30. A process target (W) is subjected to plasma processing using the plasma.

Although only one slot hole 28 is formed in the waveguide 21 in the above embodiment, multiple slot holes 28 may be formed in the waveguide 21. For example, multiple slot holes 28 extending in a propagation direction of a microwave may be aligned in a dotted line pattern.

Although a plasma generator described in Japanese translation of PCT Application No. 2002-526903 prevents generation of a reflected wave by using a terminator provided at an end portion of a waveguide, it is difficult to completely prevent generation of a reflected wave by using such a terminator. Hence, a microwave that transmits in the waveguide of the plasma generator may form a standing wave. Therefore, in such a plasma generator, the intensity of a microwave becomes non-uniform in a slot formation position of the waveguide due to the influence of a standing wave. Therefore, it is difficult to stably generate uniform plasma by using such a plasma generator.

According to a plasma generating device described in Japanese Laid-Open Patent Application No. 2012-64444, plasma is formed in a slot hole provided in a position of a microwave corresponding to an antinode portion of a standing wave, and therefore it is difficult to generate uniform plasma in a transmission direction of the microwave. In addition, using such a device, uniform plasma can be generated by providing multiple antenna units in parallel; however, the apparatus may likely become complicated and larger.

The plasma generating apparatus described in Japanese Patent No. 4900768 cancels out a reflection component of a microwave that propagates in a plasma annular resonator by guiding the reflection component to a dummy load, and the loss of a microwave is accordingly significant. Therefore, it is difficult to stably generate plasma by using such a plasma generating device.

According to one aspect of the present invention, a microwave waveguide apparatus for generating plasma has the following: a waveguide which has a first end and a second end and propagates from the first end to the second end a microwave supplied at an input end; a circulator which has a first port, a second port coupled to the first end, and a third port coupled to the second end, and which receives at the first port the microwave from the input end and couples the microwave from the second port to the first end, while receiving at the third port the microwave from the second end and returning the microwave to the input end side; and an EH tuner which is interposed between the input end and the circulator, and which reflects to the first port of the circulator a part of the microwave received at the third port of the circulator and returned to the input end side. In the waveguide of such an apparatus, a slot hole is formed extending along the propagation direction of the microwave in the waveguide.

In the microwave waveguide apparatus according to one aspect of the present invention, part of the microwave received at the third port of the circulator and returned to the input end side is returned to the first port of the circulator. By so setting, the waveguide, the circulator and the EH tuner form an annular waveguide. Hence, a microwave propagated from the input end and a microwave that circulates in an annular waveguide are superimposed, increasing the energy of a microwave in the waveguide. Further, generation of a reflected wave in the annular waveguide is prevented, consequently preventing generation of a standing wave in the waveguide and making the intensity of the microwave in the waveguide uniform. Accordingly, the microwave waveguide apparatus can guide a microwave that can stably generate plasma from the slot hole in a direction along the slot hole formed in the waveguide.

In another embodiment, the microwave waveguide apparatus may further have a first directional coupler which is arranged on a route of the waveguide, and which allows a microwave to be propagated from the first end to the second end and blocks the microwave propagated from the second end to the first end. According to such an embodiment, part of a reflected wave is blocked while a microwave circulates in the waveguide, thus preventing generation of a standing wave in the annular waveguide.

In yet another embodiment, the microwave waveguide apparatus may further have a second directional coupler which is interposed between an input end and an EH tuner, and which allows the microwave from the input end to pass and blocks the microwave from the EH tuner. According to such an embodiment, the reflected wave of a microwave is prevented from being propagated to the input end.

In yet another embodiment, the microwave waveguide apparatus may further have an isolator which is interposed between an input end and an EH tuner, and which guides the microwave from the input end to the EH tuner and guides the microwave from the EH tuner to a dummy port. According to such an embodiment, a reflected wave of a microwave is prevented from being propagated to the input end.

In yet another embodiment, the microwave waveguide apparatus may further have a microwave generator which generates a microwave and supplies the microwave to the input end, and the microwave generator may generate a pulsed microwave. The inventors found that, in the described microwave waveguide apparatus, when a pulsed microwave was supplied and dotted plasmas moved at a high speed in a traveling direction of the microwave, the plasma generated was virtually linear as a whole. The obtained plasma is highly uniform in a direction along which the slot hole is formed. Consequently, the microwave waveguide apparatus can supply a microwave that generates a highly uniform plasma.

In yet another embodiment, the microwave waveguide apparatus may further have a gas supply hole to introduce plasma generating gas into a waveguide. According to such an embodiment, the gas supplied through the gas supply hole is excited using a microwave supplied into the waveguide, and plasma of such gas is generated.

A plasma processing apparatus according to one aspect of the present invention has the following: the above microwave waveguide apparatus; a gas supply unit that supplies gas to receive energy of a microwave to be supplied to the slot hole;

and a processing container that forms space for processing a process target using gas plasma. According to the plasma processing apparatus, gas is excited by energy of a microwave supplied to a slot hole, and stable plasma is generated. Further, plasma processing on a process target is performed using the plasma.

A plasma processing apparatus according to one aspect of the present invention has the following: a microwave generator which generates a microwave and supplies the microwave to an input end; a waveguide which has a first end and a second end and propagates from the first end to the second end a microwave supplied at an input end and in which a slot hole is formed extending in a propagation direction of the microwave; a circulator which has a first port, a second port coupled to the first end, and third port coupled to the second end, and which receives at the first port the microwave from the input end and couples the microwave from the second port to the first end, while receiving at the third port the microwave from the second end and returning the microwave to the input end side; an EH tuner which is interposed between the input end and the circulator, and which reflects to the first port of the circulator a part of the microwave received at the third port of the circulator and returned to the input end side; a first directional coupler which is arranged on the route of the waveguide, and which allows a microwave which is propagated from the first end to the second end to pass, while blocking the microwave propagated from the second end to the first end; a gas supply unit which supplies gas to receive energy of the microwave to be supplied to the slot hole; and a processing container which forms space for processing a process target using gas plasma.

In the plasma processing apparatus according to one aspect of the present invention, part of the microwave received at the third port of the circulator and returned to the input end side is reflected to the first port of the circulator. By so setting, the waveguide, the circulator and the EH tuner form an annular waveguide. Accordingly, the microwave propagated from the input end and the microwave that circulates in the annular waveguide are superimposed, increasing the energy of the microwave in the waveguide. In addition, generation of a reflected wave in the annular waveguide is prevented, thus preventing generation of a standing wave in the waveguide and making the intensity of the microwave in the waveguide uniform. Furthermore, since a uniform electric field is applied to the slot portion using the uniform microwave of high energy, uniform discharge occurs to excite gas, enabling the plasma processing apparatus to stably generate plasma.

A plasma processing apparatus according to one aspect of the present invention has the following: a microwave generator which generates a microwave and supplies the microwave to the input end: a waveguide which has a first end and a second end and propagates from the first end to the second end a microwave supplied at an input end and in which a slot hole is formed extending in the propagation direction of the microwave; a circulator which has a first port, a second port coupled to the first end, and a third port coupled to the second end, and which receives at the first port the microwave from the input end and couples the microwave from the second port to the first end, while receiving at the third port the microwave from the second end and returning the microwave to the input end side; an EH tuner which is interposed between the input end and the circulator, and which reflects to the first port of the circulator a part of the microwave received at the third port of the circulator and returned to the input end side; a gas supply unit which supplies gas to receive the energy of the microwave to be supplied to the slot hole; a processing container which defines space for processing a process target using gas plasma; and a long slot hole formed in the waveguide and extending in a propagation direction of the microwave. In such a plasma processing apparatus, dotted plasma which moves in the propagation direction of the microwave is generated in the slot hole.

In the plasma processing apparatus according to one aspect of the present invention, dotted plasmas that move in a propagation direction of a microwave are generated in the slot hole. Such dotted plasmas have a higher density than that of continuously linear plasma. Further, since such dotted plasmas moves at a high speed, they are thought to have high uniformity in a direction along which the slot hole is formed. Accordingly, the plasma processing apparatus performs plasma processing using highly uniform and high-density plasma.

A plasma processing method according to one aspect of the present invention uses the above plasma processing apparatus and includes accommodating a process target in a processing container, supplying gas from a gas supply unit and processing a process target using gas plasma. The plasma processing method performs plasma processing on the process target using stable plasma as described above.

According to one embodiment, it is an option to use hydrogen gas with a concentration of 4% or less, more preferably, 0.1% to 4%. Hydrogen gas with a concentration of 0.1% to 4% is below the explosion limit, and, by using such a gas not likely to explode, provides security upon plasma processing.

As described, plasma is stably generated using the microwave waveguide apparatus, a plasma processing apparatus and a plasma processing method according to embodiments of the present invention.

Obviously, numerous modifications and variations of the present invention are possible in light of the above teachings. It is therefore to be understood that within the scope of the appended claims, the invention may be practiced otherwise than as specifically described herein.

What is claimed is:

1. A microwave waveguide apparatus for generating plasma, comprising:
   a waveguide including an introduction waveguide and an annular waveguide, the annular waveguide having a first end portion and a second end portion and configured to propagate a microwave from an input end of the waveguide such that the microwave propagates from the first end portion to the second end portion in the annular waveguide;
   a circulator device having a first port, a second port coupled to the first end portion, and a third port coupled to the second end portion, the circulator device being configured such that the microwave is received at the first port, propagates from the second port to the first end portion of the annular waveguide, is received at the third port from the second end portion and is returned toward the input end; and
   a matching device interposed between the input end and the circulator device and configured to reflect a portion of the microwave received at the third port of the circulator device and returned toward the input end to the first port of the circulator device,
   wherein the introduction waveguide is connected to the input end and the first port of the circulator device, and the annular waveguide has the first end portion coupled to the second port of the circulator device and the second end portion coupled to the third port of the circulator device and has a slot-hole portion extending along a propagation direction of the microwave propagating in the annular waveguide.

2. The microwave waveguide apparatus for generating plasma according to claim 1, further comprising a first directional coupling device positioned in the annular waveguide and configured to pass the microwave propagating from the first end portion to the second end portion of the annular waveguide and block the microwave propagating from the second end portion to the first end portion of the annular waveguide.

3. The microwave waveguide apparatus for generating plasma according to claim 2, further comprising a second directional coupling device interposed between the input end and the matching device and configured to pass the microwave propagating from the input end and block the microwave propagating from the matching device.

4. The microwave waveguide apparatus for generating plasma according to claim 2, further comprising an isolator device interposed between the input end and the matching device and configured to guide the microwave from the input end to the matching device and guide the microwave from the matching device to a dummy port.

5. The microwave waveguide apparatus for generating plasma according to claim 2, further comprising a microwave generating device configured to generate a pulsed microwave and supply the pulsed microwave to the input end.

6. The microwave waveguide apparatus for generating plasma according to claim 2, wherein the annular waveguide has a gas supply hole configured to introduce a plasma generating gas into an inner space of the annular waveguide.

7. The microwave waveguide apparatus for generating plasma according to claim 1, further comprising a second directional coupling device interposed between the input end and the matching device and configured to pass the microwave propagating from the input end and block the microwave propagating from the matching device.

8. The microwave waveguide apparatus for generating plasma according to claim 1, further comprising an isolator device interposed between the input end and the matching device and configured to guide the microwave from the input end to the matching device and guide the microwave from the matching device to a dummy port.

9. The microwave waveguide apparatus for generating plasma according to claim 1, further comprising a microwave generating device configured to generate a pulsed microwave and supply the pulsed microwave to the input end.

10. The microwave waveguide apparatus for generating plasma according to claim 1, wherein the annular waveguide has a gas supply hole configured to introduce a plasma generating gas into an inner space of the annular waveguide.

11. A plasma processing apparatus, comprising:
the microwave waveguide apparatus of claim 1;
a gas supply device configured to supply a gas such that the gas receives energy of the microwave supplied to the slot-hole portion of the annular waveguide; and
a processing container having a space configured such that plasma generated from the gas processes a process target.

12. The plasma processing apparatus according to claim 11, wherein the microwave waveguide apparatus is configured to generate dotted plasma which moves along the propagation direction of the microwave.

13. A method for processing plasma, comprising:
placing the process target in the processing container of the microwave waveguide apparatus of claim 12 such that the process target is held inside the space of the processing container;
supplying the gas from the gas supply device of the microwave waveguide apparatus of claim 12 such that the gas receives energy of the microwave supplied to the slot-hole portion of the annular waveguide of the microwave waveguide apparatus of claim 12; and
applying the plasma generated from the gas to the process target such that the plasma processes the process target in the processing container of the microwave waveguide apparatus of claim 12.

14. The method for processing plasma according to claim 13, wherein the gas is a hydrogen gas having a hydrogen concentration in a range of 0.1% to 4%.

15. A method for processing plasma, comprising:
placing the process target in the processing container of the microwave waveguide apparatus of claim 11 such that the process target is held inside the space of the processing container;
supplying the gas from the gas supply device of the microwave waveguide apparatus of claim 11 such that the gas receives energy of the microwave supplied to the slot-hole portion of the annular waveguide of the microwave waveguide apparatus of claim 11; and
applying the plasma generated from the gas to the process target such that the plasma processes the process target in the processing container of the microwave waveguide apparatus of claim 11.

16. The method for processing plasma according to claim 15, wherein the gas is a hydrogen gas having a hydrogen concentration in a range of 0.1% to 4%.

17. A plasma processing apparatus, comprising:
a microwave generating device configured to generate a microwave and supply the microwave to an input end;
a waveguide including an introduction waveguide and an annular waveguide, the annular waveguide having a first end portion and a second end portion and configured to propagate the microwave from the input end of the waveguide such that the microwave propagates from the first end portion to the second end portion in the annular waveguide, the annular waveguide having a and a slot-hole portion extending along a propagation direction of the microwave propagating in the annular waveguide;
a circulator device having a first port, a second port coupled to the first end portion, and a third port coupled to the second end portion, the circulator device being configured such that the microwave is received at the first port, propagates from the second port to the first end portion of the annular waveguide, is received at the third port from the second end portion and is returned toward the input end;
a matching device interposed between the input end and the circulator device and configured to reflect a portion of the microwave received at the third port of the circulator device and returned toward the input end to the first port of the circulator device;
a first directional coupling device positioned in the annular waveguide and configured to pass the microwave propagating from the first end portion to the second end portion of the annular waveguide and block the microwave propagating from the second end portion to the first end portion of the annular waveguide;
a gas supply device configured to supply a gas such that the gas receives energy of the microwave supplied to the slot-hole portion of the annular waveguide; and
a processing container having a space configured such that plasma generated from the gas processes a process target,
wherein the introduction waveguide is connected to the input end and the first port of the circulator device, and the annular waveguide has the first end portion coupled to the second port of the circulator device and the second end portion coupled to the third port of the circulator device and has the slot-hole portion extending along the propagation direction of the microwave propagating in the annular waveguide.

18. A method for processing plasma, comprising:
placing the process target in the processing container of the microwave waveguide apparatus of claim 17 such that the process target is held inside the space of the processing container;
supplying the gas from the gas supply device of the microwave waveguide apparatus of claim 17 such that the gas receives energy of the microwave supplied to the slot-hole portion of the annular waveguide of the microwave waveguide apparatus of claim 17; and
applying the plasma generated from the gas to the process target such that the plasma processes the process target in the processing container of the microwave waveguide apparatus of claim 17.

19. The method for processing plasma according to claim 18, wherein the gas is a hydrogen gas having a hydrogen concentration in a range of 0.1% to 4%.

20. The plasma processing apparatus according to claim 17, further comprising a second directional coupling device interposed between the input end and the matching device and configured to pass the microwave propagating from the input end and block the microwave propagating from the matching device.

* * * * *